(12) United States Patent
Chang

(10) Patent No.: US 9,203,423 B2
(45) Date of Patent: Dec. 1, 2015

(54) CLASS AB SIGNAL GENERATION APPARATUS

(71) Applicant: MEDIATEK INC., Hsin-Chu (TW)

(72) Inventor: Wen-Hua Chang, Tainan (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 198 days.

(21) Appl. No.: 13/972,920

(22) Filed: Aug. 22, 2013

(65) Prior Publication Data

US 2015/0054584 A1 Feb. 26, 2015

(51) Int. Cl.
*H03B 1/00* (2006.01)
*H03M 1/66* (2006.01)
*H03F 1/02* (2006.01)
*H03F 1/32* (2006.01)
*H03F 3/30* (2006.01)

(52) U.S. Cl.
CPC .............. *H03M 1/66* (2013.01); *H03F 1/0272* (2013.01); *H03F 1/3205* (2013.01); *H03F 1/3217* (2013.01); *H03F 3/303* (2013.01); *H03F 2200/129* (2013.01); *H03F 2200/91* (2013.01); *H03F 2203/30031* (2013.01); *H03F 2203/30078* (2013.01); *H03F 2203/30111* (2013.01)

(58) Field of Classification Search
None
See application file for complete search history.

(56) References Cited

U.S. PATENT DOCUMENTS

| | | | | |
|---|---|---|---|---|
| 5,642,078 A | * | 6/1997 | Navabi et al. | 330/253 |
| 7,292,098 B2 | * | 11/2007 | Chen et al. | 330/109 |
| 2002/0171474 A1 | * | 11/2002 | Wouters | 330/9 |
| 2007/0186668 A1 | * | 8/2007 | Garverick et al. | 73/780 |
| 2008/0191804 A1 | * | 8/2008 | An et al. | 330/255 |

* cited by examiner

*Primary Examiner* — Cassandra Cox
(74) *Attorney, Agent, or Firm* — Winston Hsu; Scott Margo

(57) ABSTRACT

A signal generation apparatus includes a digital-to-analog converter, a bias stage and a class AB output stage. The digital-to-analog converter is arranged for outputting a current as an input signal. The bias stage is coupled to the digital-to-analog converter, and is arranged for generating a bias signal according to at least the input signal. The class AB output stage is coupled to the bias stage, and is arranged for generating an output signal at an output node of the signal generation apparatus according to the bias signal, wherein the output signal includes a first signal component and a second signal component, both the first signal component and the second signal component correspond to the input signal, and there is a linear relation between the output signal and the input signal.

14 Claims, 4 Drawing Sheets

CLASS AB SIGNAL GENERATION APPARATUS

BACKGROUND

The disclosed embodiments of the present invention relate to a signal generation apparatus, and more particularly, to a signal generation apparatus capable of outputting a high-linearity class AB signal.

A transmitter with class AB operation is a good candidate for high power efficiency design. A current mode transmitter has the merit of high speed operation compared to its voltage mode counterpart. To achieve the class AB operation in a conventional current mode transmitter, both sink and source driving devices are needed in a class AB current driver. An output current of the class AB current driver is the superposition of a source current and a sink current, which correspond to a p-channel metal-oxide-semiconductor field-effect transistor (PMOS) digital-to-analog converter (DAC) and an n-channel metal-oxide-semiconductor field-effect transistor (NMOS) DAC, respectively. Due to the timing skew and gain error between the sink current and the source current, the linearity of the output current is reduced in the class AB current driver.

In a higher operating frequency, the device/timing mismatches will degrade the linearity of the output current more severely. Thus, there is a need for a novel current generation scheme to generate a high-linearity class AB output current.

SUMMARY

In accordance with exemplary embodiments of the present invention, a signal generation apparatus capable of outputting a high-linearity class AB signal is proposed to solve the above-mentioned problem.

According to a first aspect of the present invention, an exemplary signal generation apparatus is provided. The exemplary signal generation apparatus comprises an input stage, a bias stage and an output stage. The input stage is arranged for generating an input signal. The bias stage is coupled to the input stage, and is arranged for generating a bias signal according to the input signal and a feedback signal. The output stage comprises an amplifier circuit and a feedback block. The amplifier circuit is coupled to the bias stage and arranged for generating an auxiliary signal according to the bias signal. The feedback block comprises a first feedback circuit and a second feedback circuit. The first feedback circuit is coupled between an output node of the signal generation apparatus and the amplifier circuit, and is arranged for generating a specific signal according to the auxiliary signal, wherein an output signal at the output node is derived from the specific signal. The second feedback circuit is coupled between the first feedback circuit and the bias stage, and is arranged for generating the feedback signal according to the specific signal.

According to a second aspect of the present invention, an exemplary signal generation apparatus is provided. The exemplary signal generation apparatus comprises a digital-to-analog converter (DAC), a bias stage and a class AB output stage. The digital-to-analog converter is arranged for outputting a current as an input signal. The bias stage is coupled to the digital-to-analog converter, and is arranged for generating a bias signal according to at least the input signal. The class AB output stage is coupled to the bias stage, and is arranged for generating an output signal at an output node of the signal generation apparatus according to the bias signal, wherein the output signal comprises a first signal component and a second signal component, both the first signal component and the second signal component correspond to the input signal, and there is a linear relation between the output signal and the input signal.

The proposed signal generation apparatus may need only a single DAC for phase delay and amplitude mismatch between different signal components of an output signal (e.g. a source current and a sink current of a class AB current) to not occur. Additionally, the proposed signal generation apparatus may use feedback circuit(s) to align different signal components of an output signal, thereby realizing a high-linearity output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is electrically connected to another device, that connection may be through a direct electrical connection, or through an indirect electrical connection via other devices and connections.

In order to reduce/eliminate timing skew and gain error between different signal components to obtain a high-linearity output signal (the superposition of the different signal components), the proposed signal generation scheme employs a single signal generation circuit to generate an input signal, which implies that the different signal components are derived from the same input signal generated by the signal generation circuit. Hence, amplitude and phase mismatches between different signal components generated by different input signals may be improved. Additionally, feedback circuit(s) may be employed to ensure a linear relation between an input signal and an output signal (i.e. the output signal is a linear output). To facilitate understanding of the present invention, the proposed signal generation scheme is described with reference to a class AB current generation apparatus. It should be understood that the present invention is not limited to class AB current generation. Any signal generation apparatus employing the proposed signal generation scheme falls within the scope of the present invention.

Figure 1:
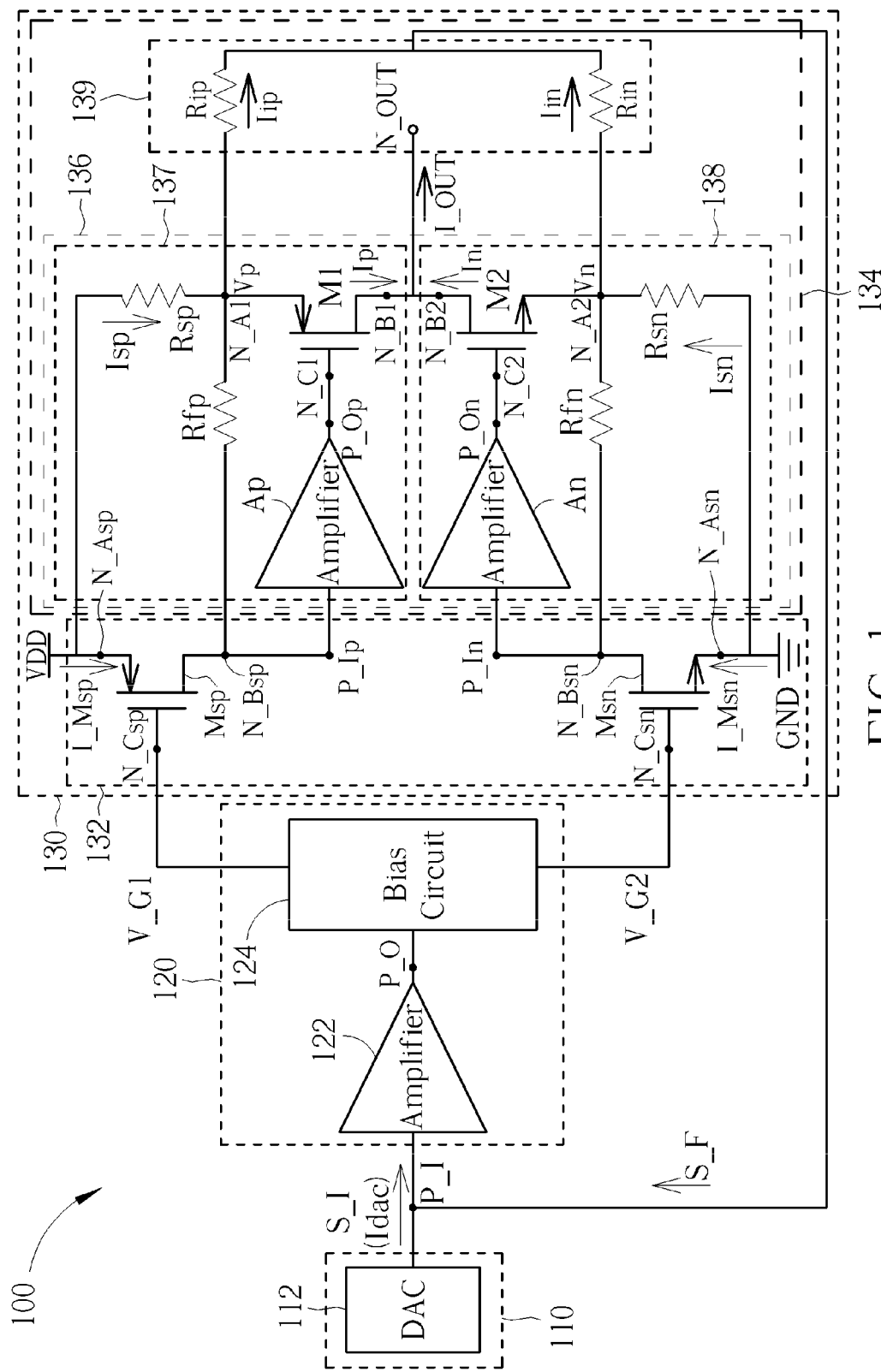
FIG. 1 is a diagram illustrating an exemplary signal generation apparatus according to a first embodiment of the present invention.

Please refer to FIG. 1, which is a diagram illustrating an exemplary signal generation apparatus 100 according to a first embodiment of the present invention. As shown in FIG. 1, the signal generation apparatus 100 includes an input stage 110, a bias stage 120 and an output stage 130. The input stage 110 is arranged to generate an input signal S_I to the bias stage 120. In this embodiment, the signal generation apparatus 100 may be implemented as a class AB current generation apparatus, and the input stage 110 may include a digital-to-analog converter (DAC) 112 (e.g. a current DAC). The DAC 112 is arranged for outputting a current Idac as the input signal S_I. The bias stage 120 is coupled to the input stage 110, and is arranged to generate a bias signal (including a bias voltage V_G1 and a bias voltage V_G2) to the output stage 130 according to the input signal S_I and a feedback signal S_F generated from the output stage 130. The output stage 130 may output an output current I_OUT at an output node N_OUT of the signal generation apparatus 100 according to the bias signal.

The bias stage 120 may include an amplifier 122 and a bias circuit 124. The amplifier 122 has an input port P_I and an output port P_O, wherein the input port P_I is coupled to the input stage 110 (or the DAC 112), and the output port P_O is coupled to the bias circuit 124. The bias circuit 124 is arranged for generating the bias signal according to an output signal of the amplifier 122. The output stage 130 may include an amplifier circuit 132 and a feedback block 134. The amplifier circuit 132 may include, but is not limited to, a transistor Msp and a transistor Msn. A control node N_Csp, a connection node N_Asp and a connection node N_Bsp of the transistor Msp are coupled to the bias circuit 124, a reference voltage VDD and the feedback block 134, respectively. A control node N_Csn, a connection node N_Asn and a connection node N_Bsn of the transistor Msn are coupled to the bias circuit 124, a ground voltage GND and the feedback block 134, respectively. The transistor Msp is arranged to generate a current I_Msp according to the bias voltage V_G1, and the transistor Msn is arranged to generate a current I_Msn according to the bias voltage V_G2. In this embodiment, the bias voltages V_G1 and V_G2 generated by the bias circuit 124 may enable the amplifier circuit 132 to operate in a class AB mode.

The feedback block 134 may include a first feedback circuit 136 and a second feedback circuit 139, wherein the first feedback circuit 136 is coupled between the amplifier circuit 132 and the output node N_OUT, and the second feedback circuit 139 is coupled between the first feedback circuit 136 and the bias stage 120. In this embodiment, the first feedback circuit 136 may include a first feedback unit 137 and a second feedback unit 138, wherein the first feedback unit 137 is coupled between the connection node N_Bsp and the output node N_OUT, and the second feedback unit 138 is coupled between the connection node N_Bsn and the output node N_OUT. The first feedback unit 137 may include, but is not limited to, an amplifier Ap, a transistor M1 and resistive elements Rfp and Rsp. An input port P_Ip of the amplifier Ap is coupled to the connection node N_Bsp, and an output port P_Op of the amplifier Ap is coupled to a control node N_C1 of the transistor M1. The resistive element Rfp is coupled between the input port P_Ip and a connection node N_A1 of the transistor M1, the resistive element Rsp is coupled between the reference voltage VDD and a connection node N_A1 of the transistor M1, and a connection node N_B1 is coupled to the output node N_OUT. Similarly, the second feedback unit 138 may include, but is not limited to, an amplifier An, a transistor M2 and resistive elements Rfn and Rsn. An input port P_In of the amplifier An is coupled to the connection node N_Bsn, and an output port P_On of the amplifier An is coupled to a control node N_C2 of the transistor M2. The resistive element Rfn is coupled between the input port P_In and a connection node N_A2 of the transistor M2, the resistive element Rsn is coupled between the ground voltage GND and a connection node N_A2 of the transistor M2, and a connection node N_B2 is coupled to the output node N_OUT.

As shown in FIG. 1, the first feedback unit 137 forms a closed loop circuit; therefore, the connection node N_Bsp may be regarded as virtual ground (i.e. the voltage variation thereof is relatively small). After the transistor Msp generates the current I_Msp to the first feedback unit 137 according to the bias voltage V_G1, the current I_Msp may flow into the resistive element Rfp rather than the amplifier Ap, and a voltage Vp at the connection node N_A1 may be represented as I_Msp×Rfp. In addition, the amplifier Ap may turn on the transistor M1 by outputting a bias voltage to the control node N_C1, thereby generating a current Isp flowing through the resistive element Rsp. The current Isp may be represented as Vp/Rsp (i.e. I_Msp×Rfp/Rsp), and a current Ip flowing through the transistor M1 may be represented as:

$$Ip = I\_Msp + I\_Msp \times Rfp / Rsp.$$

The second feedback unit 138 also forms a closed loop circuit. After the transistor Msn generates the current I_Msn to the second feedback unit 138 according to the bias voltage V_G2, the current I_Msn may flow into the resistive element Rfn rather than the amplifier An, and a voltage Vn at the connection node N_A2 may be represented as I_Msn×Rfn. In addition, a current In flowing through the transistor M2 may further include a current Isn flowing through the resistive element Rsn, which may be represented as Vn/Rsn (i.e. I_Msn×Rfn/Rsn). The current In flowing through the transistor M2 may be represented as:

$$In = I\_Msn + I\_Msn \times Rfn / Rsn.$$

In view of the above, current components flowing through the transistor M1 have a linear relation with the current I_Msp, and current components flowing through the transistor M2 have a linear relation with the current I_Msn. When the currents I_Msp and I_Msn are class AB currents, the output current I_OUT (the superposition of the currents Ip and In) outputted from the output node N_OUT may also be a class AB current. To ensure that the output current I_OUT is a class AB current, the second feedback circuit 139 may be used to generate the feedback signal S_F according to the voltages Vp and Vn so that the bias stage 120 may generate the currents I_Msp and I_Msn having class AB characteristics accordingly.

In this embodiment, the second feedback circuit 139 may include a resistive element Rip and a resistive element Rin. The resistive element Rip is coupled between the first feedback unit 137 (or the connection node N_A1) and the bias stage 120 (or the input port PI), and the second resistive element Rin is coupled between the second feedback unit 138 (or the connection node N_A2) and the bias stage 120 (or the input port P_I). As the second feedback circuit 139 is a negative feedback circuit coupled between the bias sage 120 and the output stage 130, the input port P_I may be regarded as virtual ground (i.e. the voltage variation thereof is relatively small). Thus, the current Iip flowing through the resistive element Rip may be represented as Vp/Rip (i.e. I_Msp×Rfp/

Rip), and the current Iin flowing through the resistive element Rin may be represented as Vn/Rin (i.e. I_Msn×Rfn/Rin). In addition, the input signal S_I (i.e. the current Idac) outputted from the DAC 112 may be cancelled by the current Iip and the current Iin:

$$Idac=I\_Msp \times Rfp/Rip+I\_Msn \times Rfn/Rin.$$

In other words, there is a linear relation between the current I_Msp/I_Msn and the current Idac. When the current Idac generated from DAC 112 is a sinusoidal signal, both the currents I_Msp and I_Msn may have class AB characteristics. Thus, there is also a linear relation between the output current I_OUT and the current Idac. A class AB current generation apparatus having a high-linearity output current can be realized.

The aforementioned signal generation scheme may be summarized as below. The amplifier circuit 132 may generate an auxiliary signal (e.g. the current I_Msp/I_Msn) according to the bias signal (e.g. the bias voltage V_G1/V_G2) generated from the bias stage 120; the first feedback circuit 136 may generate a specific signal (e.g. the voltage Vp/Vn) according to the auxiliary signal; next, the second feedback circuit 139 may generate the feedback signal S_F (e.g. the current Iip/Iin) according to the specific signal, and the bias stage 120 may generate the bias signal again according to the input signal S_I and the feedback signal S_F; finally, the output stage 130 may generate an output signal S_O (e.g. the output current I_OUT) according to the specific signal. Additionally, in order to ensure a linear relation between the input signal S_I and the output signal S_O, the proposed signal generation apparatus may be properly designed to make the specific signal have a linear relation with the auxiliary signal, make the feedback signal S_F have a linear relation with the specific signal, and make the feedback signal S_F identical to the input signal S_I.

It should be noted that the above circuit topology is for illustrative purposes only, and is not meant to be a limitation of the present invention. In one implementation, as long as the first feedback unit 137/the second feedback unit 138 may generate the specific signal according to the auxiliary signal so that the specific signal has a linear relation with the auxiliary signal, the circuit architecture of the first feedback unit 137/the second feedback unit 138 may be different from that shown in FIG. 1. In addition, the circuit architecture of the first feedback unit 137 may be different from that of the second feedback unit 138. In another implementation, as long as the second feedback circuit 139 may generate the feedback signal S_F (identical to the input signal S_I) according to the specific signal, the circuit architecture of the second feedback circuit 139 may be different from that shown in FIG. 1.

Figure 2:
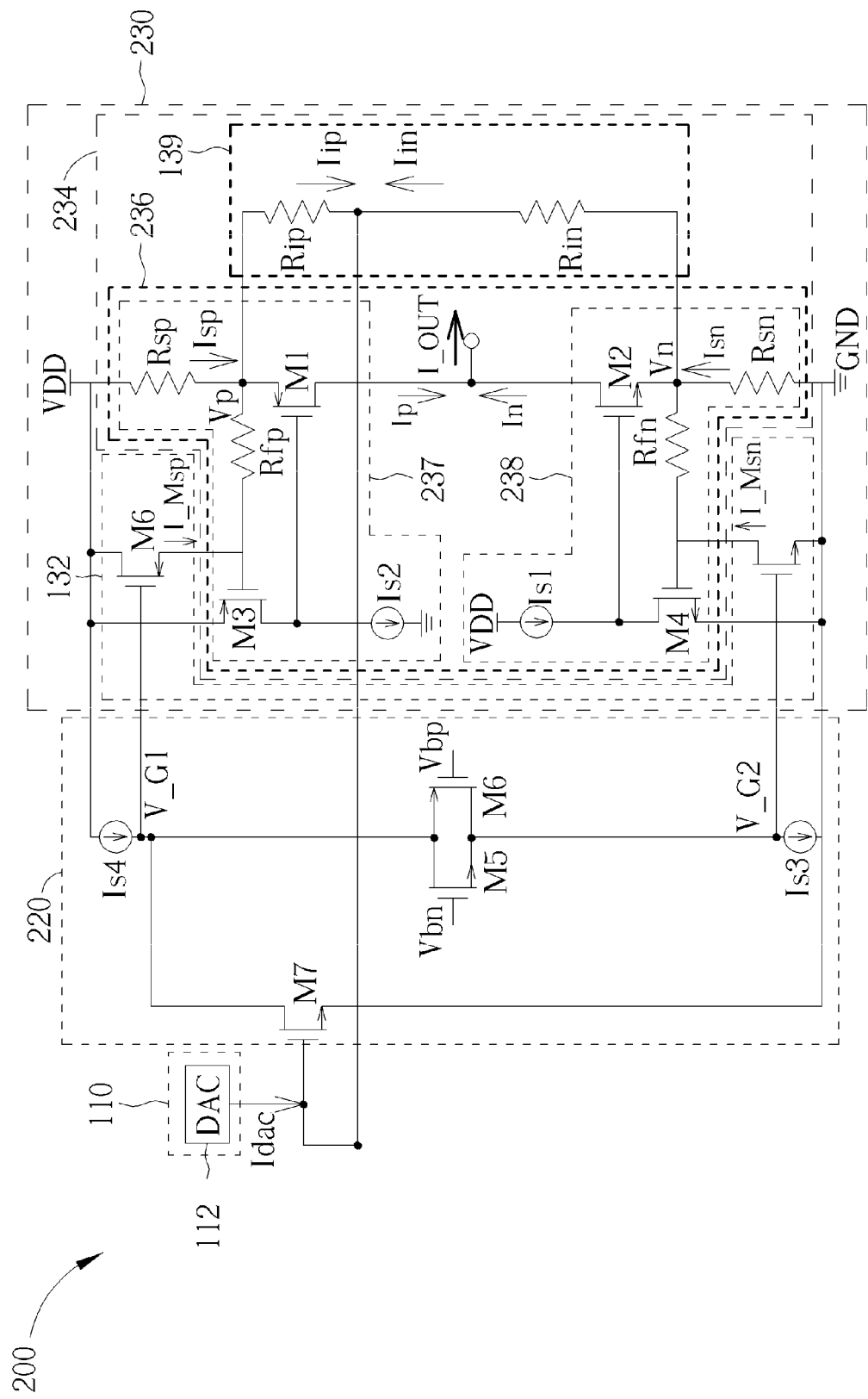
FIG. 2 is a diagram illustrating an exemplary signal generation apparatus according to a second embodiment of the present invention.

Please refer to FIG. 2, which is a diagram illustrating an exemplary signal generation apparatus 200 according to a second embodiment of the present invention. The circuit architecture of the signal generation apparatus 200 is based on that of the signal generation apparatus 100 shown in FIG. 1. The signal generation apparatus 200 may include the input stage 110 shown in FIG. 1, a bias stage 220 and an output stage 230, wherein the bias stage 120 shown in FIG. 1 may be implemented by the bias stage 220, and the output stage 130 shown in FIG. 1 may be implemented by the bias stage 230. More specifically, the amplifier 122 shown in FIG. 1 may be implemented by a transistor M7, and the bias circuit 124 may be implemented by a current source Is3, a current source Is4, a transistor M5 and a transistor M6. In this embodiment, the transistor M5 and the transistor M6 are controlled by floating gate biases Vbp and Vbn to implement a push-pull circuit, and the transistor Msp and the transistor Msn will be operated in a class AB mode. As a person skilled in the art should understand that the floating gate bias may enable a next stage to be operated in a class AB mode, further description is omitted here for brevity.

The output stage 230 may include the amplifier circuit 132 shown in FIG. 1 and a feedback block 234, wherein the feedback block 234 includes a first feedback circuit 236 and the second feedback circuit 139 shown in FIG. 1. In this embodiment, the first feedback circuit 236 includes a first feedback unit 237 and a second feedback unit 238. The first feedback unit 237 may include the transistor M1, the resistive element Rfp and the resistive element Rsp shown in FIG. 1, a transistor M3 and a current source Is2. The amplifier Ap shown in FIG. 1 may be implemented by the transistor M3 and the current source Is2. The second feedback unit 238 may include the transistor M2, the resistive element Rfn and the resistive element Rsn shown in FIG. 1, a transistor M4 and a current source Is1. The amplifier An shown in FIG. 1 may be implemented by the transistor M4 and the current source Is1.

The transistors Msp and Msn may generate the currents I_Msp and I_Msn according to the bias voltages V_G1 and V_G2, respectively. The first feedback unit 237 may first convert the current I_Msp into the voltage Vp, and then convert the voltage Vp into the current Ip. As the first feedback unit 237 is a high-gain closed loop circuit, there is a linear relation among the current I_Msp, the voltage Vp and the current Ip. Similarly, the second feedback unit 238 may first convert the current I_Msn into the voltage Vn, and then convert the voltage Vn into the current In, wherein the current I_Msn, the voltage Vn and the current In are linearly correlated. The output current Idac generated from the DAC 112 may be cancelled by the currents Iip and Iin generated from the second feedback circuit 139. In other words, the sinusoidal input current Idac may be provided to the output stage 230 through two paths, thereby realizing the output current I_OUT having the class AB characteristics. As a person skilled in the art should understand the operation of the signal generation apparatus 200 shown in FIG. 2 after reading paragraphs directed to FIG. 1, further description is omitted here for brevity.

Figure 3:
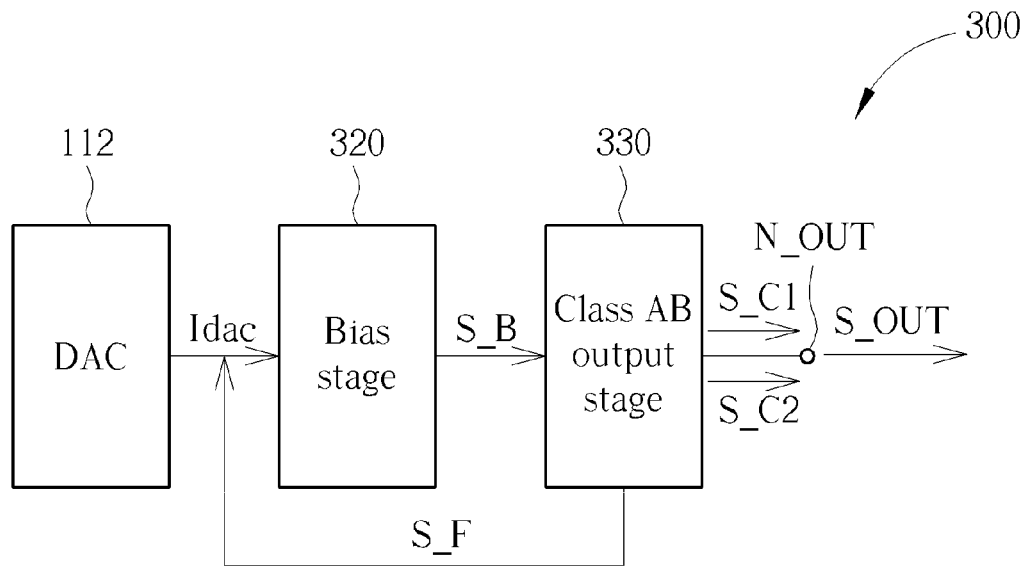
FIG. 3 is a block diagram illustrating an exemplary class AB signal generation apparatus according to a first embodiment of the present invention.

Please note that the above linear conversion circuits are for illustrative purposes only and are not meant to be limitations of the present invention. For example, other type of linear conversion circuit (instead of a feedback circuit) may be used to convert the current I_Msp/I_Msn into the voltage Vp/Vn shown in FIG. 2. Please refer to FIG. 1, FIG. 2 and FIG. 3 together. FIG. 3 is a block diagram illustrating an exemplary class AB signal generation apparatus 300 according to a first embodiment of the present invention. The signal generation apparatus 300 may include the DAC 112 shown in FIG. 1, a bias stage 320 and a class AB output stage 330. The bias stage 320 is coupled to the DAC 112, and is arranged for generating a bias signal S_B according to a received input signal (i.e. the input current Idac) and a feedback signal S_F. The class AB output stage 330 is coupled to the bias stage 320, and is arranged for generating the feedback signal S_F according to the bias signal S_B, and generating an output signal S_OUT (e.g. a class AB output current) at an output node N_OUT of the signal generation apparatus 300 according to the bias signal S_B. The output signal S_OUT includes a first signal component S_C1 (e.g. a source current) and a second signal component S_C2 (e.g. a sink current), wherein both the first signal component S_C1 and the second signal component S_C2 correspond to the input current Idac, the feedback signal S_F is identical to the input current Idac, and there is a linear relation between the output signal S_OUT and the input current Idac.

The bias stage 320 may employ the circuit architecture shown in FIG. 1/FIG. 2 to generate the feedback signal S_F and the bias signal S_B. The class AB output stage 330 may employ the circuit architecture shown in FIG. 1/FIG. 2 to generate the voltage Vp/Vn according to the bias signal (e.g. the bias voltages V_G1 and V_G2), and accordingly generate the feedback signal S_F (e.g. the currents Iip and Iin) and the output signal S_OUT (e.g. the output current I_OUT). In one implementation, the class AB output stage 330 may employ other type of linear conversion circuit to generate the voltages Vp and Vn, and accordingly generate the feedback signal S_F (e.g. the currents Iip and Iin) and the output signal S_OUT (e.g. the output current I_OUT).

Figure 4:
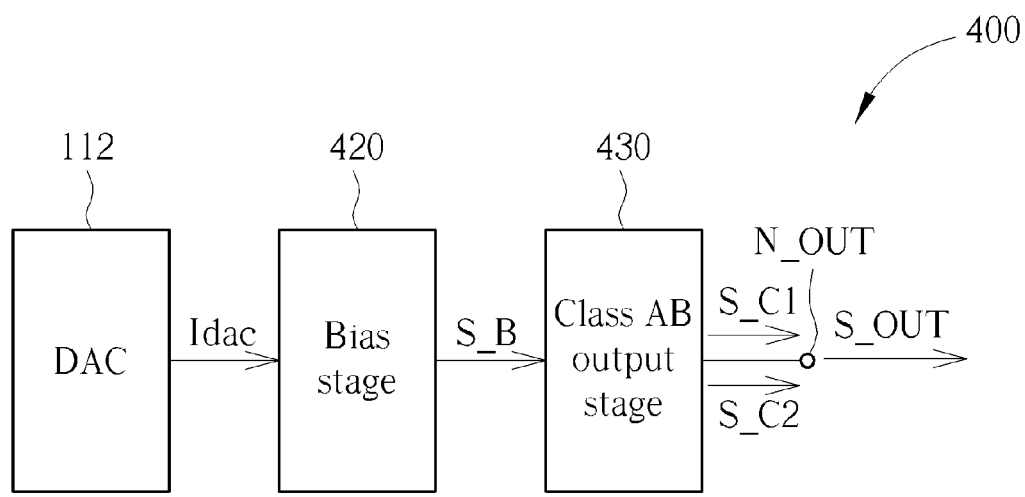
FIG. 4 is a block diagram illustrating an exemplary class AB signal generation apparatus according to a second embodiment of the present invention.

As mentioned above, the second feedback circuit 139 shown in FIG. 1/FIG. 2 may be used to ensure the class AB characteristics of the currents I_Msp and I_Msn. To put it another way, when the currents I_Msp and I_Msn have had the class AB characteristics already, the feedback signal S_F does not need to be generated. Please refer to FIG. 4, which is a block diagram illustrating an exemplary class AB signal generation apparatus 400 according to a second embodiment of the present invention. The circuit architecture of the signal generation apparatus 400 is based on that of the signal generation apparatus 300 shown in FIG. 3, wherein the difference is that the class AB output stage 430 does not generate a feedback signal to the bias stage 420. For example, when an amplifier circuit included in the class AB output stage 430 (not shown in FIG. 4) may generate a class AB current signal according to the bias signal S_B, the class AB output stage 430 does not need to generate a feedback signal to the bias stage 420.

Figure 5:
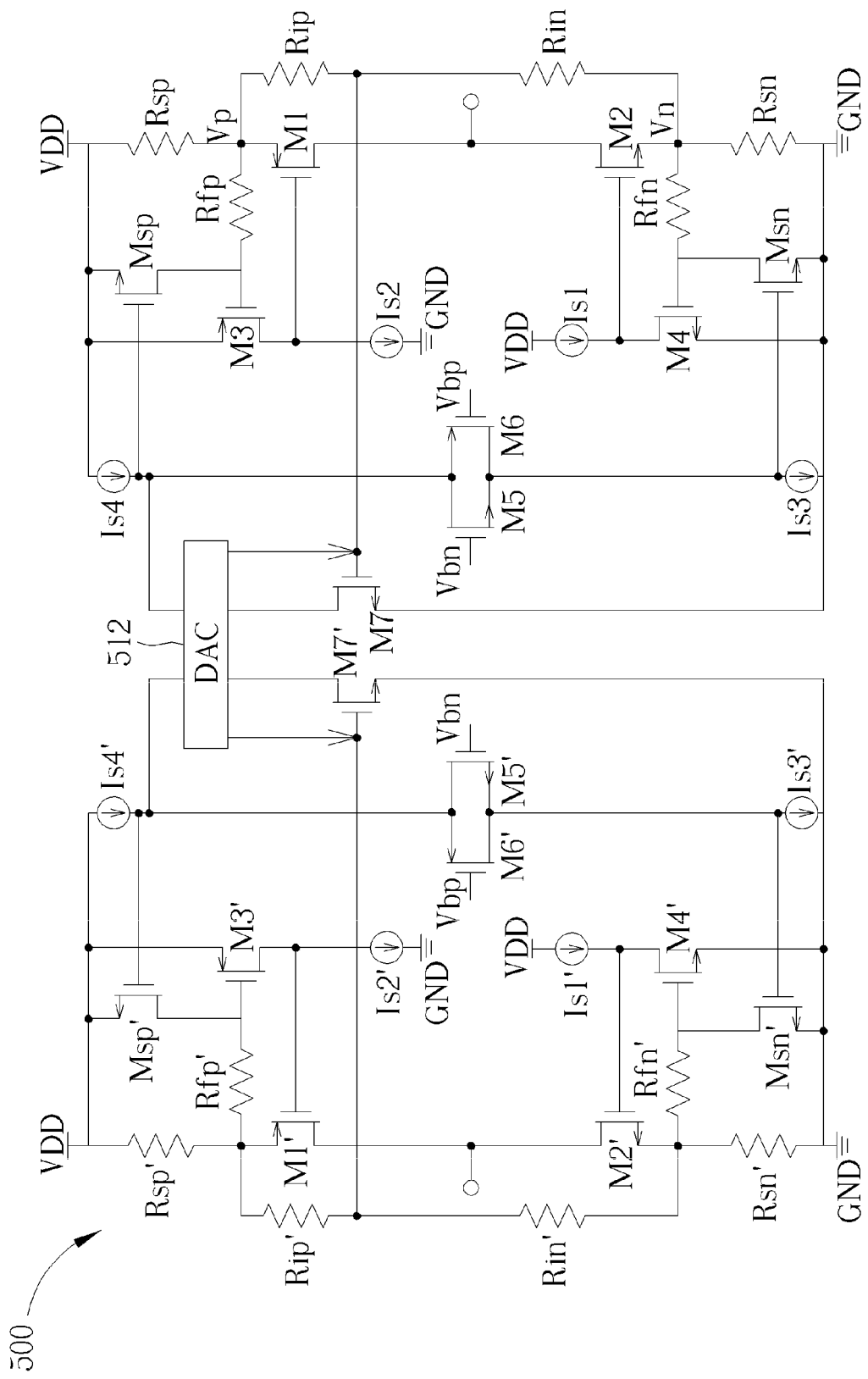
FIG. 5 is a diagram illustrating an exemplary signal generation apparatus according to a third embodiment of the present invention.

Please refer to FIG. 5 in conjunction with FIG. 2. FIG. 5 is a diagram illustrating an exemplary signal generation apparatus 500 according to a third embodiment of the present invention. As shown in FIG. 5, the signal generation apparatus 500 is implemented with a differential topology of the signal generation apparatus 200 shown in FIG. 2. The right portion of the signal generation apparatus 500 may be implemented by the signal generation apparatus 200, and the left portion of the signal generation apparatus 500 may include the following elements: a plurality of transistors Msp', Msn' and M1'-M7', a plurality of current sources Is1'-Is4', and a plurality of resistive elements Rfp', Rsp', Rip', Rfn', Rsn' and Rin'. Please note that, as only a single DAC 512 is used, the linearity of the output signal may be greatly improved. As a person skilled in the art should understand the operation of the signal generation apparatus 500 shown in FIG. 5 after reading paragraphs directed to FIG. 1 and FIG. 2, further description is omitted here for brevity.

To sum up, as the proposed signal generation apparatus may need only a single DAC for phase delay and amplitude mismatch between different signal components of an output signal (e.g. a source current and a sink current of a class AB current) to not occur. Additionally, the proposed signal generation apparatus may use feedback circuit(s) to align different signal components of an output signal, thereby realizing a high-linearity output signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal generation apparatus, comprising:
   an input stage, arranged for generating an input signal;
   a bias stage, coupled to the input stage, the bias stage arranged for generating a bias signal according to the input signal and a feedback signal; and
   an output stage, comprising:
      an amplifier circuit, coupled to the bias stage and arranged for generating an auxiliary signal according to the bias signal; and
      a feedback block, comprising:
         a first feedback circuit, coupled between an output node of the signal generation apparatus and the amplifier circuit, the first feedback circuit arranged for generating a specific signal according to the auxiliary signal, wherein an output signal at the output node is derived from the specific signal; and
         a second feedback circuit, coupled between the first feedback circuit and the bias stage, the second feedback circuit arranged for generating the feedback signal according to the specific signal;
   wherein the input stage comprises a digital-to-analog converter (DAC) arranged for outputting a current as the input signal.

2. The signal generation apparatus of claim 1, wherein there is a linear relation between the specific signal and the auxiliary signal, there is a linear relation between the feedback signal and the specific signal, and the input signal is identical to the feedback signal.

3. The signal generation apparatus of claim 1, wherein the amplifier circuit is biased by the bias signal to operate in a class AB mode.

4. The signal generation apparatus of claim 1, wherein the auxiliary signal comprises a first auxiliary signal and a second auxiliary signal, the specific signal comprises a first specific signal and a second specific signal, and the first feedback circuit comprises:
   a first feedback unit, arranged for generating the first specific signal according to the first auxiliary signal; and
   a second feedback unit, arranged for generating the second specific signal according to the second auxiliary signal.

5. The signal generation apparatus of claim 4, wherein the first feedback unit comprises:
   an amplifier, having an input port and an output port;
   a transistor, having a control node, a first connection node and a second connection node, wherein the control node is coupled to the output port, and the second connection node is coupled to the output node of the signal generation apparatus;
   a first resistive element, coupled between the input port and the first connection node, the first resistive element arranged for receiving the first auxiliary signal to generate the first specific signal at the first connection node; and
   a second resistive element, coupled between a reference voltage and the first connection node.

6. The signal generation apparatus of claim 4, wherein the feedback signal comprises a first feedback signal and a second feedback signal, and the second feedback circuit comprises:
   a first resistive element, coupled between the first feedback unit and the bias stage, the first resistive element arranged for generating the first feedback signal according to the first specific signal; and
   a second resistive element, coupled between the second feedback unit and the bias stage, the second resistive element arranged for generating the second feedback signal according to the second specific signal.

7. The signal generation apparatus of claim 1, wherein the bias stage comprises:
   an amplifier, having an input port and an output port, wherein the input port is coupled to the input stage and the second feedback circuit; and
   a bias circuit, coupled to the output port of the amplifier, the bias circuit arranged for generating the bias signal according to an output signal of the amplifier.

8. A signal generation apparatus, comprising:
   a digital-to-analog converter (DAC), arranged for outputting a current as an input signal;
   a bias stage, coupled to the digital-to-analog converter, the bias stage arranged for generating a bias signal according to at least the input signal; and
   a class AB output stage, coupled to the bias stage, the class AB output stage arranged for generating an output signal at an output node of the signal generation apparatus according to the bias signal, wherein the output signal comprises a first signal component and a second signal component, both the first signal component and the second signal component correspond to the input signal, and there is a linear relation between the output signal and the input signal;
   wherein the class AB output stage further generates a feedback signal according to the bias signal, the bias stage generates the bias signal according to the input signal and the feedback signal, and the input signal is identical to the feedback signal.

9. The signal generation apparatus of claim 8, wherein the class AB output stage comprises:
   an amplifier circuit, coupled to the bias stage and arranged for generating an auxiliary signal according to the bias signal; and
   a feedback block, comprising:
      a first feedback circuit, coupled between the output node and the amplifier circuit, the first feedback circuit arranged for generating a specific signal according to the auxiliary signal, wherein the output signal is derived from the specific signal; and
      a second feedback circuit, coupled between the first feedback circuit and the bias stage, the second feedback circuit arranged for generating the feedback signal according to the specific signal.

10. The signal generation apparatus of claim 9, wherein there is a linear relation between the specific signal and the auxiliary signal, and there is a linear relation between the feedback signal and the specific signal.

11. The signal generation apparatus of claim 9, wherein the auxiliary signal comprises a first auxiliary signal and a second auxiliary signal, the specific signal comprises a first specific signal and a second specific signal, and the first feedback circuit comprises:
   a first feedback unit, arranged for generating the first specific signal according to the first auxiliary signal; and
   a second feedback unit, arranged for generating the second specific signal according to the second auxiliary signal.

12. The signal generation apparatus of claim 11, wherein the first feedback unit comprises:
   an amplifier, having an input port and an output port;
   a transistor, having a control node, a first connection node and a second connection node, wherein the control node is coupled to the output port, and the second connection node is coupled to the output node of the signal generation apparatus;
   a first resistive element, coupled between the input port and the first connection node, the first resistive element arranged for receiving the first auxiliary signal to generate the first specific signal at the first connection node; and
   a second resistive element, coupled between a reference voltage and the first connection node.

13. The signal generation apparatus of claim 11, wherein the feedback signal comprises a first feedback signal and a second feedback signal, and the second feedback circuit comprises:
   a first resistive element, coupled between the first feedback unit and the bias stage, the first resistive element arranged for generating the first feedback signal according to the first specific signal; and
   a second resistive element, coupled between the second feedback unit and the bias stage, the second resistive element arranged for generating the second feedback signal according to the second specific signal.

14. The signal generation apparatus of claim 8, wherein the bias stage comprises:
   an amplifier, having an input port and an output port, wherein the input port is coupled to the digital-to-analog converter and the class AB output stage; and
   a bias circuit, coupled to the output port of the amplifier, the bias circuit arranged for generating the bias signal according to an output signal of the amplifier.

* * * * *